(12) United States Patent  
Yamazaki et al.

(10) Patent No.: US 6,703,671 B1
(45) Date of Patent: Mar. 9, 2004

(54) INSULATED GATE SEMICONDUCTOR DEVICE AND METHOD OF MANUFACTURING THE SAME

(75) Inventors: Shunpei Yamazaki, Tokyo (JP); Takeshi Fukunaga, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 09/362,804

(22) Filed: Jul. 28, 1999

Related U.S. Application Data

(63) Continuation of application No. 08/914,869, filed on Aug. 19, 1997, now Pat. No. 5,952,699.

(30) Foreign Application Priority Data

Aug. 23, 1996 (JP) ................................................ 8-241257

(51) Int. Cl.[7] .......................... H01L 29/76; H01L 29/94; H01L 31/062; H01L 31/113; H01L 31/119
(52) U.S. Cl. ...................... 257/404; 257/339; 257/345; 257/402
(58) Field of Search ................................. 257/335, 345, 257/342, 340, 339, 341, 372, 376, 402, 403, 404, 133

(56) References Cited

U.S. PATENT DOCUMENTS

| | | | | |
|---|---|---|---|---|
| 5,065,216 A | * | 11/1991 | Suzuki et al. ............... | 257/517 |
| 5,198,879 A | * | 3/1993 | Ohshima ..................... | 257/20 |
| 5,210,437 A | | 5/1993 | Sawada et al. | |
| 5,426,325 A | * | 6/1995 | Chang et al. ............... | 257/408 |
| 5,428,234 A | * | 6/1995 | Sumi .......................... | 257/287 |
| 5,449,937 A | * | 9/1995 | Arimura et al. ............ | 257/345 |
| 5,606,191 A | * | 2/1997 | Wang .......................... | 257/336 |
| 5,608,231 A | * | 3/1997 | Ugajin et al. ................ | 257/24 |
| 5,635,749 A | * | 6/1997 | Hong .......................... | 257/402 |
| 5,698,884 A | * | 12/1997 | Dennen ....................... | 257/345 |
| 5,801,416 A | * | 9/1998 | Choi et al. .................. | 257/335 |
| 5,831,294 A | * | 11/1998 | Ugajin ....................... | 257/191 |
| 5,952,699 A | * | 9/1999 | Yamazaki et al. .......... | 257/404 |
| 6,072,199 A | * | 6/2000 | Iwamuro ..................... | 257/139 |

FOREIGN PATENT DOCUMENTS

| | | | | |
|---|---|---|---|---|
| JP | 59-149057 | * | 8/1984 | .......... H01L/29/78 |
| WO | WO 88/03328 A1 | | 5/1988 | |

\* cited by examiner

*Primary Examiner*—Shouxiang Hu
(74) *Attorney, Agent, or Firm*—Fish & Richardson P.C.

(57) ABSTRACT

Impurity regions 110 that can form an energy barrier are artificially and locally disposed in a channel formation region 111. The impurity regions 110 restrain a depletion layer that extends from a drift region 102 toward a channel formation region 111, and prevents a short channel effect caused by the depletion layer, with the result that an insulated gate semiconductor device high in withstand voltage can be manufactured without lowering the operation speed.

13 Claims, 10 Drawing Sheets

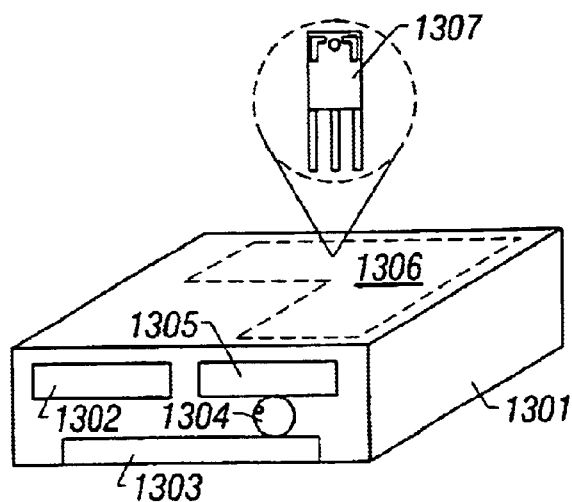
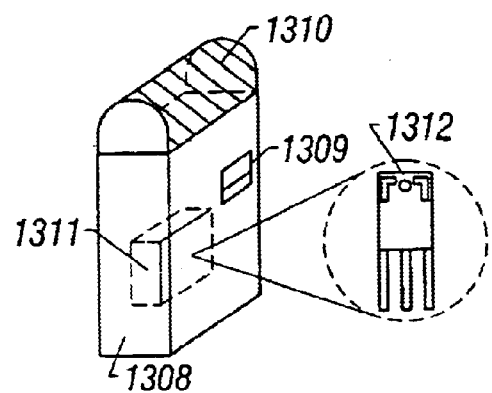
FIG. 13A
FIG. 13B
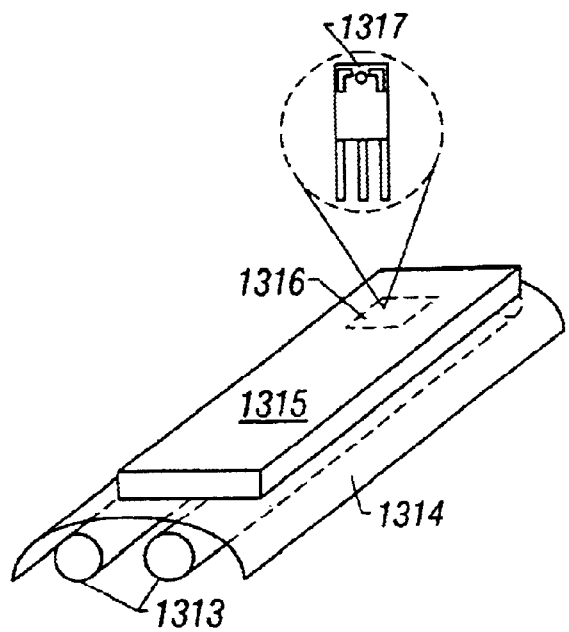
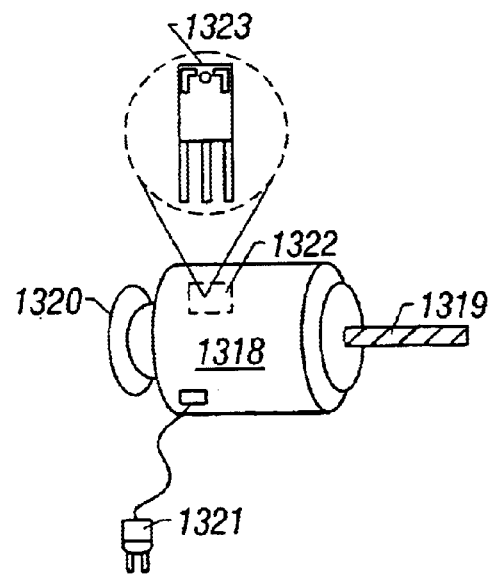
FIG. 13C
FIG. 13D though a gate insulating film 205.
INSULATED GATE SEMICONDUCTOR DEVICE AND METHOD OF MANUFACTURING THE SAME This application is a continuation of application Ser. No. 08/914,869 filed Aug. 19, 1997 now U.S. Pat. No. 5,952,699

BACKGROUND OF THE INVENTION

1. Field of the Invention

The present invention relates to an insulated gate semiconductor device for controlling a large power, in particular to a semiconductor device which is called "a power MOS device" and a method of manufacturing the same. Representatively, there are a power MOS FET (hereinafter referred to simply as "power MOS") which is an MOS gate device, an IGBT (insulated gate bipolar transistor), etc.

2. Description of the Related Art

In recent years, the semiconductor devices have been tended to be made more fine so that the machining dimensions of a deep sub-micron region are required. However, there has been known that, in the MOS FET, when a channel formation region is identical in dimension with the deep sub-micron region, there arises a problem such as the phenomenon of a short channel effect.

The short channel effect is the phenomenon developed because the charges in the channel formation region are largely influenced by not only a gate voltage but also the charges in a depletion layer of a source/drain region, an electric field and a potential distribution as the line width of a gate electrode is shortened, that is, a channel formation region is shortened. There has been known that the short channel effect leads to a variety of problems such as the lowering of a threshold value voltage, the deterioration of a sub-threshold characteristic, the deterioration of a withstand voltage, and so on.

The problem of the above phenomenon is common to all of the device having an MOS structure that operates with the formation of a channel. This is also seen in the power MOS device for controlling a large power without exception. There are many cases in which the power MOS device requires a high withstand voltage because there are used a large current and a large voltage, and therefore the deterioration of a withstand voltage caused by the short channel effect leads to a large problem.

In general, the power MOS device is directed to a semiconductor device which is used as a switching device of an electronic equipment, or the like, and the power devices of a high-speed MOS such as a power MOS or an IGBT have been known as examples. These semiconductor devices are characterized in that they are different in structure from an IC or an LSI because a large voltage and a large current are used.

A basic structure of a single cell of the power MOS is shown in FIG. 2. In the figure, marks represented by "+" or "−" are used as an index representing the relative strength of conductivity. In other words, for example, n$^+$ represents n-type stronger than n$^-$.

In FIG. 2, a weak n-type (n$^-$) region 202 that is called "a drift region" is formed on a semiconductor substrate 201 having an n$^+$-type through an epitaxial growth. The semiconductor substrate 201 having the n$^+$-type functions as a drain region as it is.

Also, a strong p-type (p$^+$) region 203 is formed on the drift region 203 through an impurity diffusion, and a source region 204 having the n$^+$-type is also disposed therein. A part of the strong p-type (p$^+$) region 203, which is located immediately under a gate electrode, functions as a channel formation region. Then, it is structured such that a gate electrode 206 is disposed on a semiconductor surface through a gate insulating film 205.

In case of the power MOS structure of this type, when a positive voltage is applied to the gate electrode 206, a channel region 207 is formed in the p-type region (channel formation region) 203 in the vicinity of the gate electrode 206 so that a current flows in a direction indicated by an arrow (in case of the enhancement n-channel FET).

In this way, the MOS IC used for an IC or an LSI is structured such that a current flows laterally in the vicinity of the surface of the semiconductor substrate, whereas the power MOS shown in FIG. 2 is characterized in that source/drain regions are disposed so as to sandwich the semiconductor substrate therebetween so that a current flows vertically.

The reason why the power MOS is structured such that a current flows vertically as described above is that an on-state resistance (a resistant value of all the regions in which a drain current flows) is reduced to increase a current density. This is one of important structures for the power MOS which allows a large current to flow therein and performs a high-speed operation.

Hence, in the case where a high-speed operation characteristic is required, it is desirable that a resistively of the drift region is small, but on the contrary, in the case where a high withstand voltage characteristic is required, it is devised that the resistively of the drift region is made large to improve the withstand voltage.

However, in the case where the high-speed operation characteristic is required, when the resistively of the drift region is made small, there may arise such a problem that the device is destroyed because the withstand voltage exceeds a limit when the withstand voltage is deteriorated by the short channel effect.

A state where the short channel effect is developed in the power MOS is simplified and shown in FIG. 3. FIG. 3 represents an enlarged diagram of the periphery of the channel region 207 shown in FIG. 2.

In FIG. 3, reference numeral 301 denotes a drift region formed of a weak n-type (n$^-$); 302 is a channel formation region formed of a strong p-type (p$^+$); 303 is a source region formed of a strong n-type (n$^+$); 304 is a channel region; and 305 is a gate electrode. Also, a dotted line indicated by reference numeral 306 represents a depletion layer formed when the drain voltage is small.

Normally, a current that flows in the channel region 304 is controlled by only the gate voltage. In this case, as indicated by reference numeral 306, the depletion layer in the vicinity of the channel region 304 is disposed substantially in parallel with the channel to form a uniform electric field.

However, as the drain voltage becomes high, the depletion layer in the vicinity of the drift region 301 extends toward the channel region 3,04 and the source region 303 so that, as represented by a solid line 307, the charges or the electric field of the drain depletion layer adversely affect the depletion layer in the vicinity of the source region 303 and the channel region 304. In other words, an on-state current is varied by the complicated distribution of the electric field, thereby leading to a circumstance where it is difficult to control the current which flows in the source region 303 and the channel region 304 by only the gate voltage.

An energy state of the periphery of the channel formation region in the case where the short channel effect is developed will be described with reference to FIG. 4. In FIG. 4, respective illustrations of states indicated by solid lines show an energy band in the vicinity of the source region 401, the p-type region (channel formation region) 402 and the drift region 403 when the drain voltage is 0 V.

In that state, when a sufficiently large drain voltage Vd is applied, the states indicated by the solid lines are changed into states indicated by dotted lines in FIG. 4. In other words, the charges and the electric field in the depletion layer of the drift region which are formed by the drain voltage Vd adversely affect the charges in the depletion layers of the source and channel formation regions 401 and 402, with the result that the energy (potential) state changes continuously from the source region 401 to the drift region 403.

Then, as an influence of the short channel effect on the semiconductor device, there occurs the lowering of the threshold value voltage (Vth) and the punch-through phenomenon. Also, when an influence of the gate voltage on the drain current is lowered by the punch-through phenomenon, the sub-threshold characteristic is deteriorated.

First, the lowering of the threshold value voltage is a phenomenon that occurs in the n-channel FET as well as the p-channel FET. Also, the degree of the lowering depends not only on the drain voltage, but also on a variety of parameters such as the concentration of the impurities in the substrate, the depth of the source/drain diffusion layers, the thickness of the gate oxide film, the substrate bias, and so on.

Although the lowering of the threshold value voltage is desirable from the viewpoint that it makes the power consumption small, it generally leads to a problem that the frequency characteristic does not become high because the drive voltage of the integrated circuit becomes small.

For that reason, up to now, it is general that as means for controlling the threshold value voltage, impurity elements that give one conductivity are uniformly added to the whole channel formation region, and the threshold value voltage is controlled with the amount of the impurity elements as added. However, even this method cannot prevent the short channel effect per se, whereby the punch-through phenomenon and so on are caused to occur. Also, since the impurities as added scatter the carriers, they cause the mobility of the carriers to be lowered.

Also, the deterioration of the sub-threshold characteristic which is caused by the punch-through phenomenon means that the sub-threshold coefficient (S-value) increases, that is, the switching characteristic of the FET is deteriorated. An influence of the short-channel effect on the sub-threshold characteristic is shown in FIG. 5.

FIG. 5 is a graph whose horizontal axis represents the gate voltage Vg, and whose vertical axis represents the logarithm of the drain current Id, and the inverse number of a slope (the sub-threshol d characteristic) in the region 501 is the S-value. In FIG. 5, changes of the characteristics when the channel length is gradually shortened are compared, and the channel length is shortened toward a direction indicated by an arrow.

As a result, the slope of the characteristic becomes small as the channel length is shortened. In other words, it can be confirmed that there is a tendency that the S-value is increased. This means that the switching characteristic of the semiconductor device is more deteriorated as the channel length is shortened.

As described above, the phenomenon of the short channel effect is a serious problem even in the power MOS device, and a problem to be solved for making the semiconductor device fine in the future.

In particular, in the power MOS device, the high-speed operation characteristic and the high-withstand voltage characteristic have a relation of a trade-off, and in the case where an importance is given to the high-speed operation characteristic, the deterioration of the withstand voltage which is caused by the short channel effect is remarkable as a problem of the destruction of device.

SUMMARY OF THE INVENTION

The present invention has been made in view of the above circumstances, and therefore an object of the present invention is to provide an insulated gate semiconductor device that realizes both of the high-speed operation characteristic and the high-withstand voltage characteristic simultaneously, in particular, a power MOS device and a method of manufacturing the same.

In order to solve the above problem, according to one aspect of the present invention, there is provided an insulated gate semiconductor device, comprising:

a source region, a drain region, a drift region and a channel formation region, which are formed using a crystal semiconductor; and a gate insulating film and a gate electrode formed on said channel formation region;

wherein said channel formation region includes a region in which carriers move, and an impurity region artificially and locally formed for pining a depletion layer that extends from said drift region toward said channel formation region and said source region.

According to another aspect of the present invention, there is provided an insulated gate semiconductor device, comprising:

a source region, a drain region, a drift region and a channel formation region, which are formed using a crystal semiconductor; and a gate insulating film and a gate electrode formed on said channel formation region;

wherein said channel formation region includes a region in which carriers move, and an impurity region artificially and locally formed for controlling to a predetermined threshold value voltage by addition of impurity elements.

In the present specification, the crystal semiconductor is, as a representative example, a monocrystal silicon with a grade which is normally used in the level of the existing IC and VLSI, but also includes a monocrystal silicon with a higher grade (to the extreme, monocrystal silicon in an ideal state such that it is fabricated in space).

The subject matter of the present invention is to effectively restrain the expansion of a depletion layer from the drift region toward the channel formation region by an impurity region which is artificially locally formed in the channel formation region, thereby preventing a variety of problems such as the punch-through phenomenon and the deterioration of the sub-threshold characteristic and the deterioration of the withstand voltage, which are caused by the short channel effect.

Since the device of the present invention is formed as if pins of an impurity region are formed in the channel formation region, the present applicant calls the device "pining type power MOS device". In the present specification, "pining" means "restraint", and "pin" means "restrain".

In other words, the impurity region is locally formed in the channel formation region, and that region is used as an energy barrier. Using the impurity region as the energy barrier, the depletion layer on the drift region side is energy-restrained from extending toward the channel formation region side, whereby an electric field formed in the channel formation region is controlled by only the gate voltage.

In the present invention, there are used impurity elements that extend the energy band width (Eg) as the impurity elements that form the impurity region for achieving the above structure. The impurity elements of this type are one kind or a plurality of kinds selected from carbon (C), nitrogen (N) and oxygen (O).

In this case, the added impurities form an energy barrier which is locally large in an energy band width within the channel formation region. In the case of using carbon, nitrogen or oxygen as in the present invention, the energy band which was in a state shown in FIG. 6A becomes a state shown in FIG. 6B, and the energy band width (Eg) is widened whereby the barrier $\Delta E$ further increases to the barrier $\Delta AE'$. For example, in the case where oxygen is added, it becomes an insulating high-resistant region having a structure represented by $SiO_x$, which forms an electrically barrier.

Also, impurity elements can be used which allow the energy band width to be shifted other than the above impurity elements. The impurity elements of this type are the elements of group XIII (representatively, boron) and the elements of group XV (representatively, phosphorus or arsenic). In the present invention, the elements of group XIII are used in the case of manufacturing the n-channel power MOS, and the elements of group XV are used in the case of manufacturing the p-channel power MOS.

In both the cases, since the channel formation region and the impurity region are identical in conductive type with each other, it is desirable that the impurity region is set to be higher than the channel formation region. Also, in the case where the channel formation region is substantially intrinsic, the concentration of the impurity region can be lowered.

The impurity region added with these impurity elements function to change the energy band configuration of the channel region and to either increase or reduce the threshold voltage. Accordingly, the concentration of the added impurity in the impurity region should be sufficiently high to at least control the threshold voltage, for example, $1\times10^{17}$ to $1\times10^{20}$ atoms/cm$^3$, preferably, $1\times10^{18}$ to $1\times10^{19}$ atoms/cm$^3$.

The concentration of the impurity should be at least 100 times as high as the impurity concentration of the substrate (in a typical single crystal silicon substrate, it is about $1\times10^{15}$/cm$^3$), hence, $1\times10^{17}$/cm$^3$ is the lower limit. Also, if the concentration exceeds $1\times10^{20}$ atoms/cm$^3$, it is not desirable in view of the burden of the device.

Also, it is desirable to activate the added impurity element by furnace annealing, laser annealing or lamp annealing, or the like. Care should be taken to suppress the thermal diffusion of the impurity during the annealing. For example, the sufficient activation can be achieved by the furnace annealing at 500–800° C. (preferably, 600–700° C.) While suppressing the thermal diffusion.

The substrate may be heated during the ion implantation in order to simultaneously activate the impurity. Also, the activation efficiency can be improved by increasing an RF power of the ion implantation. This may be used solely or in combination with the foregoing annealing step.

In this case, the impurities added locally shifts the energy band in the channel formation region. For example, in the case where boron is added to the n-channel power MOS, the energy band which was in a state shown in FIG. 7A is changed into a state shown in FIG. 7B, and the Fermi level (Ef) is shifted so that the barrier $\Delta E$ further increases to the barrier $\Delta E'$. It is needless to say that in this case, the shifting of the Fermi level is resultantly nothing other than the shifting of the energy band of the channel formation region.

Also, that region has an inverse conductivity to the channel region, and forms a sufficient energy barrier although it is low in resistant value. Similarly, in the case where phosphorus or arsenic is added to the p-channel power MOS, an inverse conductive region is formed so that it can be applied as an energy barrier.

According to yet still another aspect of the present invention, there is provided an insulated gate semiconductor device, comprising:

a source region, a drain region, a drift region and a channel formation region, which are formed using a crystal semiconductor; and a gate insulating film and a gate electrode formed on said channel formation region;

wherein said channel formation region includes a region in which carriers move, and an impurity region artificially and locally formed for pining a depletion layer that extends from said drift region toward said channel formation region and said source region, and for regulating a carrier moving path by said impurity region.

Also, according to yet still another aspect of the present invention, there is provided an insulated gate semiconductor device, comprising:

a source region, a drain region, a drift region and a channel formation region, which are formed using a crystal semiconductor; and a gate insulating film and a gate electrode formed on said channel formation region;

wherein said channel formation region includes a region in which carriers move, and an impurity region artificially and locally formed for controlling to a predetermined threshold value voltage by addition of impurity elements, and for regulating a carrier moving path by said impurity region.

The impurity regions can be provided in the form of a dot pattern or in the form of a linear pattern within the channel formation region. In particular, in the case where the impurity regions are provided in the form of a linear pattern which is substantially in parallel with the channel direction (a direction along which the carriers move), the impurity regions form side walls that function as rails along which the carriers move. As a result, because the carrier moving path is regulated, there is obtained an advantage that the possibility of scattering caused by the collision of the carriers with each other is reduced to improve the mobility.

As described above, with the formation of the impurity regions being artificially and locally formed in the channel formation region, the region in which the carriers move and the impurity regions for pining the depletion layer that extends from the drift region toward the channel formation region are disposed in the same channel formation region, thereby being capable of preventing the deterioration of various characteristics which are caused by the short channel effect.

Also, the lowering of the threshold value voltage which is a representative phenomenon caused by the short channel effect which is accompanied by the fining of the channel length is relieved by artificially developing the narrow channel effect between the respective impurity regions. This is also one of the significant structures of the present invention.

The narrow channel effect is a phenomenon that develops phenomenons such as an increase of the threshold value voltage by narrowing the channel formation region, and frequently leads to a problem in the MOS IC. The present invention has an effect that the narrow channel effect is intentionally developed using this phenomenon to control the threshold value voltage so that the lowering the threshold value voltage accompanied by the short channel effect is offset.

Also, according to yet still another aspect of the present invention, there is provided a method of manufacturing an insulated gate semiconductor device, said method comprising the steps of:

forming a source region, a drain region, a drift region and a channel formation region, using a crystal semiconductor;

artificially and locally forming impurity regions in said channel formation region; and forming a gate insulating film and a gate electrode on said channel formation region;

wherein said channel formation region is composed of a region in which carriers move, and said impurity regions; and wherein impurity elements that extend an energy band width (Eg) are artificially and locally added in said impurity regions.

Further, according to yet still another aspect of the present invention, there is provided a method of manufacturing an insulated gate semiconductor device, said method comprising the steps of:

forming a source region, a drain region, a drift region and a channel formation region, using a crystal semiconductor;

artificially and locally forming impurity regions in said channel formation region; and forming a gate insulating film and a gate electrode on said channel formation region;

wherein said channel formation region is composed of a region in which carriers move, and said impurity regions; and wherein impurity elements that shift an energy band width (Eg) are artificially and locally added in said impurity regions.

BRIEF DESCRIPTION OF THE DRAWINGS

These and other objects, features and advantages of the present invention will become more fully apparent from the following detailed description taken with the accompanying drawings in which:

FIGS. 13A to 13D are diagrams showing products to which the power MOS device is applied.

DETAILED DESCRIPTION OF THE PREFERRED EMBODIMENTS

Now, a description will be given in more detail of preferred embodiments of the present invention with reference to the accompanying drawings.

EMBODIMENT 1

Figure 1A:
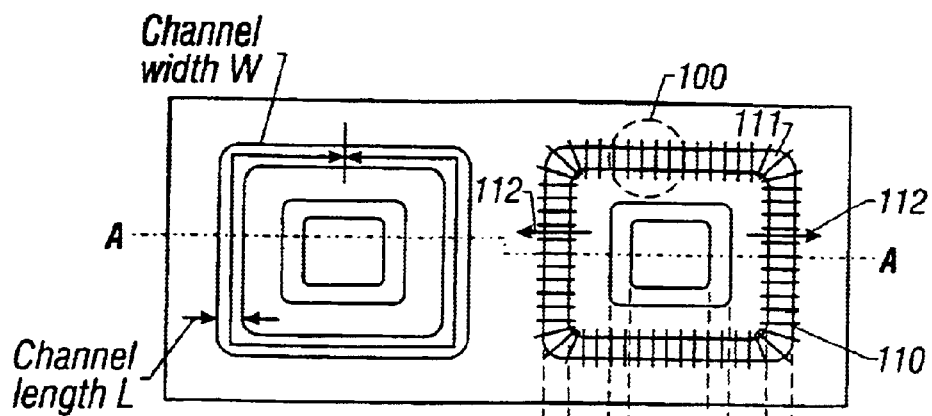
FIGS. 1A to 1C are diagrams showing the structure of a power MOS device.
Figure 1B:
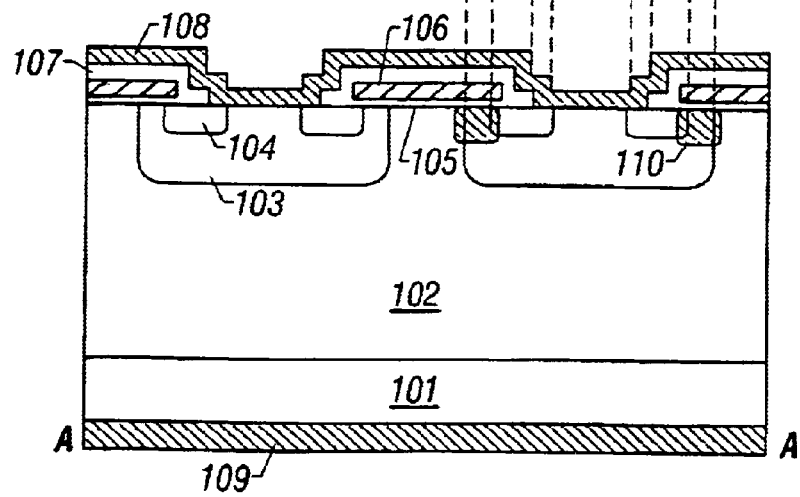
Figure 1C:
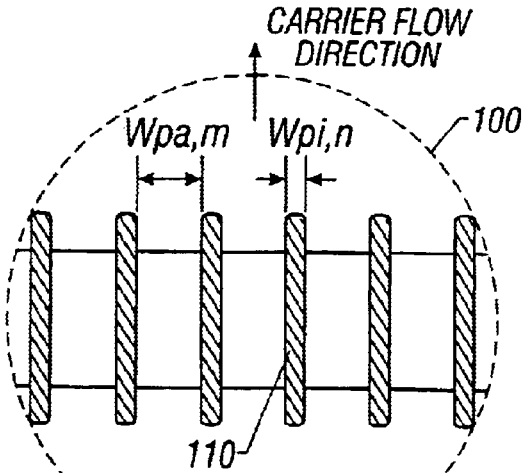
Figure 2:
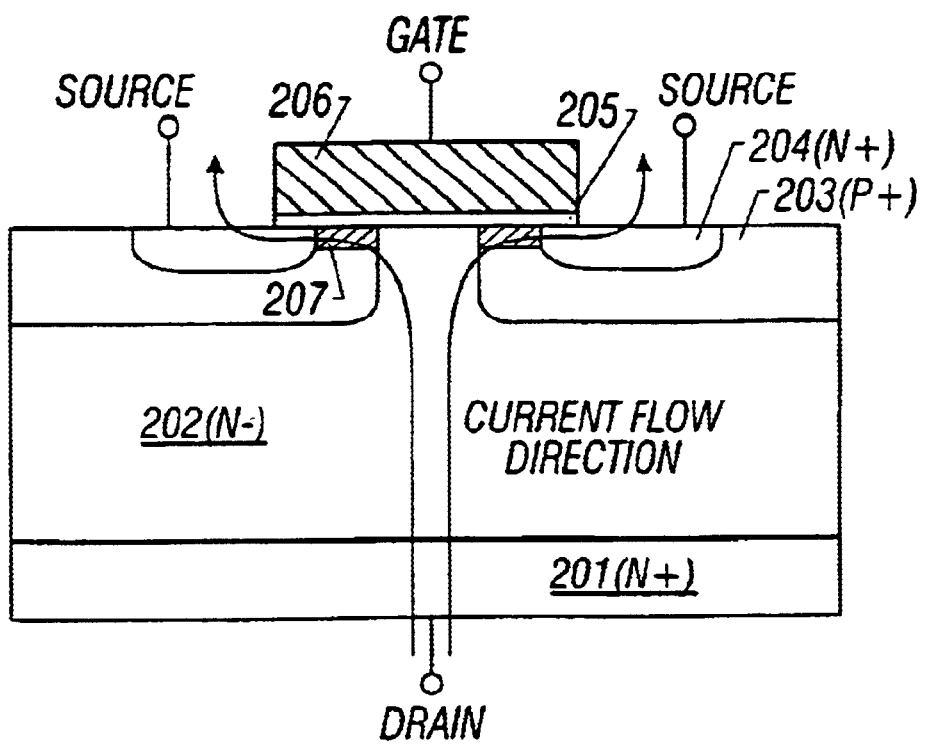
FIG. 2 is a diagram showing the structure of a power MOS device.

FIGS. 1A to 1C show the structure of a power MOS FET in accordance with one embodiment of the present invention. FIG. 1A is a top view of the power MOS, and although only two single cells are shown in this embodiment, cells of several hundreds to several ten thousands are normally disposed on one chip to form the power MOS.

FIG. 1B is a cross-sectional view taken along a dotted line A–A' of FIG. 1A. The cell on the right side of FIG. 1A is cut so that impurity regions appear on its cross section, whereas the cell on the left side of FIG. 1A is cut so that impurity regions do not appear on its cross section. Also, FIG. 1C is an enlarged diagram showing the inside of a circle indicated by reference numeral 100 in FIG. 1A.

In FIG. 1B, reference numeral 101 denotes a semiconductor substrate that forms a drain region, and is formed of an $n^+$-type silicon substrate in this embodiment because an n-channel FET is exemplified. Reference numeral 102 denotes an $n^-$-type silicon layer formed through an epaxial growth, which functions as a drift region. Reference numeral 103 denotes a $p^+$-type conductive region that forms a channel formation region which is formed through impurity diffusion. Reference numeral 104 denotes an $n^+$-type conductive region that forms a source region.

The channel formation region 103 is formed by inverting the $n^-$-type silicon layer with impurity elements (for example, boron) that give p-type conductivity. However, if the concentration of the impurity elements are adjusted so that the n-type conductivity is offset, a substantially intrinsic channel formation region can be formed.

Furthermore, a gate electrode 106 which is formed of a polysilicon film is disposed above the semiconductor layer through a gate insulating film 105 which is formed of a silicon oxide film, and an interlayer insulating film 107 formed of a silicon film and a source electrode 108 made of a conductive material are formed in such a manner that they cover the gate electrode 106. A drain electrode 109 made of a conductive material is formed on the drain region 101 side.

The above description is limited to a vertical double diffusion structure which is a representative power MOS structure. The feature of the present invention resides in that impurity regions 110 for forming an energy barrier are formed in a channel formation region (a region where the conductive region 103 of $p^+$-type (or substantially i-type) and the gate electrode 106 are superimposed on each other).

The impurity regions 110 may be made of one or a plurality of kinds of elements selected from carbon, nitrogen and oxygen, or boron which belongs to an element of group XIII in case of the n-channel FET as in the present embodiment. This embodiment will be described referring to a case of using oxygen as the impurity elements.

In the case of using oxygen as the impurity elements, the impurity region forms an insulating region which is expressed by, for example, $SiO_x$. The impurity region of this type effectively pins a depletion layer that extends from the drift region 102 toward the channel formation region 111 because it extends the energy band width and acts as an energy barrier.

Also, since the impurity regions 110 are very fine regions, it is desirable to employ the fine lithography technique such as the electronic drawing method or the FIB method rather than the normal light exposing method. In this way, the present invention is different from the conventional channel doping in that impurities are not implanted in the whole channel formation region, but the impurity regions are artificially and locally formed.

Positions where the impurity regions 110 are formed are shown in FIG. 1A when being viewed from the top surface of the power MOS (The reason the impurity regions are shown in FIG. 1B is that a cross section of the linear pattern cut off vertically is viewed).

In FIG. 1A, a closed region 111 is a region where the $p^+$-type conductive region 103 and the gate electrode 106 are completely superimposed on each other, and forms the channel formation region. Also, a carrier flowing direction is indicated by reference numeral 112, and the impurity regions in the form of a linear pattern are disposed so as to be substantially in parallel with the carrier flowing direction (channel direction). It should be noted that in this embodiment, since the n-channel FET is exemplified, the carrier (electrons) flowing direction is opposite to the current flowing direction.

Also, as shown in the left side of FIG. 1A, in the present specification, a channel width W is defined by a distance that goes round of the channel formation region 111 along the center line thereof, and a channel length L is defined by a distance by which the carriers cross the channel formation region.

This embodiment is characterized in that the impurity regions in the form of a linear pattern are formed in the channel formation region 111. The linear pattern is required to satisfy conditions with a certain limit, which will be described hereinafter.

First, a width which is occupied by the impurity region 110 in the channel width W is defined as Wpi. The value of Wpi is sufficiently set to, for example, 10 to 100 Å. Also, if the widths of the arbitrary impurity regions 110 are $Wpi_{,1}$, $Wpi_{,2}$, $Wpi_{,3}$, ... $WPi_{,n}$ as shown in FIG. IC, then Wpi is represented by the following expression.

$$Wpi = \sum_{n=1}^{n} Wpi, n \qquad [\text{EX. 1}]$$

In order to achieve the structure of the present invention, since it is required that at least one impurity region is formed in a region other than the end portions of the channel formation region, n is an integer of 1 or more.

A width each occupied by regions (current flowing paths) between the respective impurity regions 10 in the channel width W is defined as Wpa. The value of Wpa can be set to, for example, 100 to 3000 Å (representatively, 500 to 1500 Å). Also, if the regions between the arbitrary impurity regions 110 are $Wpa_{,1}$, $Wpa_{,2}$, $Wpa_{,3}$, ... $Wpa_{,m}$, Wpa is represented by the following expression.

$$Wpi = \sum_{m=1}^{m} Wpa, m \qquad [\text{EX. 2}]$$

Since at least one impurity region is formed in a region other than the end portions of the channel formation region as described above, the channel formation region is divided into at least two, and m is an integer of 2 or more.

In other words, with respect to the total channel width W, there is established the relations wherein W=Wpi+Wpa and (n+m) is 3 or more. Then, the respective relations of W and Wpi, W and Wpa, and Wpi and Wpa desirably satisfy the following conditions at the same time.

Wpi/W=0.1 to 0.9

Wpa/W=0.1 to 0.9

Wpi/Wpa=⅑ to 9

What is meant by those expressions are that Wpa/W or Wpi/W must not be 0 or 1. For example, in case of Wpa/W=0 (the same meaning as that of Wpi/W=1), since the channel formation region is completely closed by the impurity region, there comes to a state that no path through which a current flows exists.

On the contrary, in case of Wpa/W=1 (the same meaning as that of Wpi/W=0), since the impurity region does not exist in the channel formation region at all, the depletion layer that extends from the drift region cannot be restrained.

For the above reasons, it is desirable that the relational expressions of Wpa/W and Wpi/W fall into a range of 0.1 to 0.9 (preferably 0.2 to 0.8), and also Wpi/Wpa=⅑ to 9 is satisfied.

Figure 3:
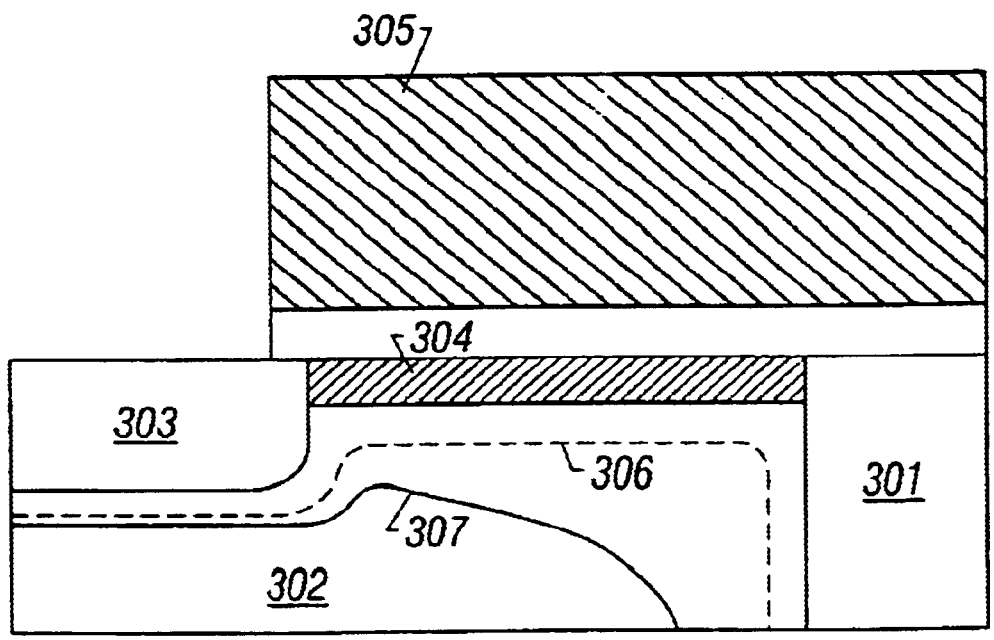
FIG. 3 is a diagram showing the structure of a power MOS device.
Figure 8:
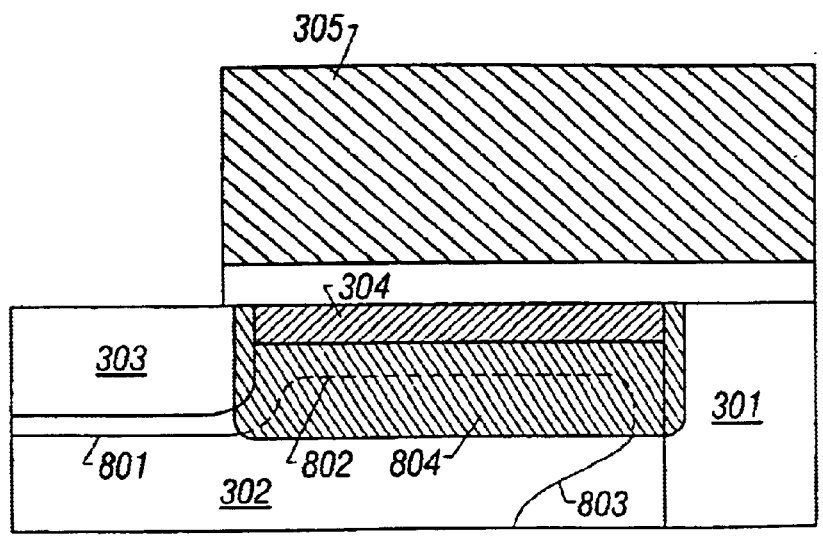
FIG. 8 is a diagram showing the structure of a power MOS device.

In the case of manufacturing the power MOS according to the present invention, how to restrain the short channel effect will be described with reference to FIG. 8. FIG. 8A is an enlarged diagram showing the channel formation region of the same structure as that in FIG. 3 (the same symbols as those in FIG. 3 are used).

First, in the case of applying a gate voltage and a drain voltage to the power MOS having the structure shown in FIG. 1, a depletion layer 801 in the vicinity of the source region 303, a depletion layer 802 in the vicinity of the channel region 304, and a depletion layer 803 in the vicinity of the drift region 301 are formed in a state shown in FIG. 8A. In other words, the depletion layer 803 in the vicinity of the drift region 301 is designed in such a manner that the impurity regions 804 form barriers, which prevent the depletion layer 803 from extending in the vicinity of the channel region 304.

Although being difficult to understand the prevention of such extension from FIG. 8A, since the impurity regions 804 are disposed as shown in the right side of FIG. 1A, a mode facilitates the understanding, where the extension of the depletion layer of the drift region 301 is restrained by a lattice-like filter that closes the channel formation region.

Hence, in the power MOS having the structure according to the present invention, the depletion layer is divided substantially without any mutual interference as shown in FIG. 8A. In other words, the depletion layer 801 in the vicinity of the source region 303 and the depletion layer 802 in the vicinity of the channel region 304 are distributed while they are little influenced by the depletion layer 803 in the vicinity of the drift region 301.

Figure 4:
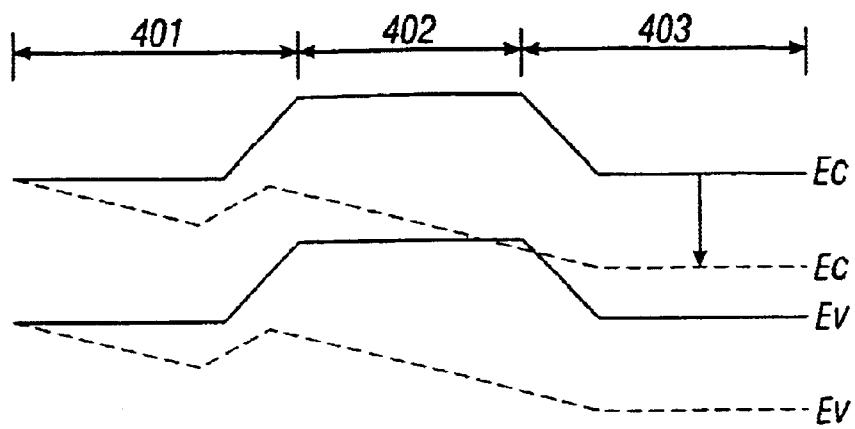
FIG. 4 is a diagram for explaining an energy state.

In other words, since the energy state of the channel region 304 is controlled by only the electric field which is almost caused by the gate voltage, being different from the conventional energy state shown in FIG. 4, it is substantially in parallel with the channel region 304. Therefore, the power MOS high in withstand voltage characteristic can be realized without any problem such as the punch-through phenomenon inherent to the short channel effect.

Further, as is apparent from the comparison of FIG. 3 with FIG. 8A, because a volume occupied by the depletion layer in the present invention is reduced in comparison with the conventional one shown in FIG. 3, the present invention is characterized in that the charges in the depletion layer are smaller and the capacity in the depletion layer is smaller than those in the prior art. An expression that leads to the S-value is represented by the following expression.

$$S=d(Vg)/d(\log 1d) \quad [\text{EX. 3}]$$

Figure 5:
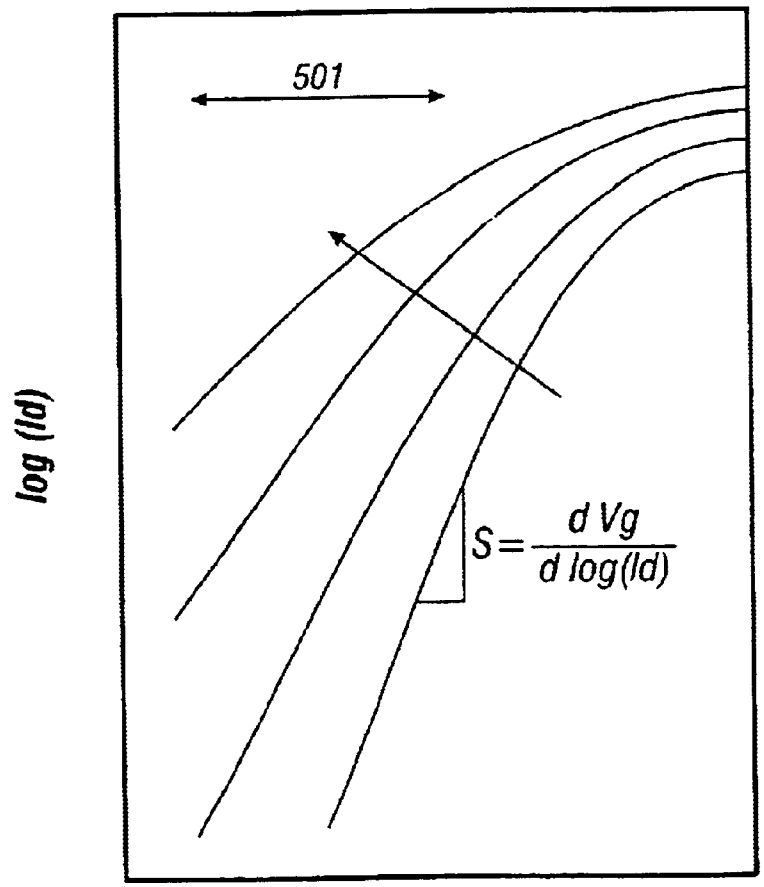
FIG. 5 is a diagram showing the electric characteristic of the MOS device.
Figure 6A:
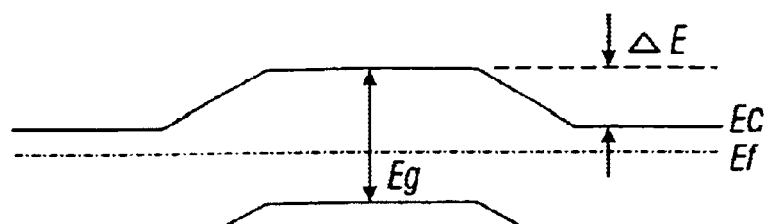
FIGS. 6A and 6B are diagrams for explaining an energy state.
Figure 6B:
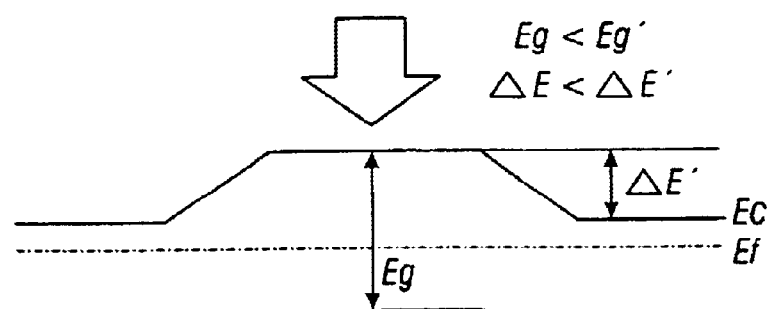
Figure 7A:
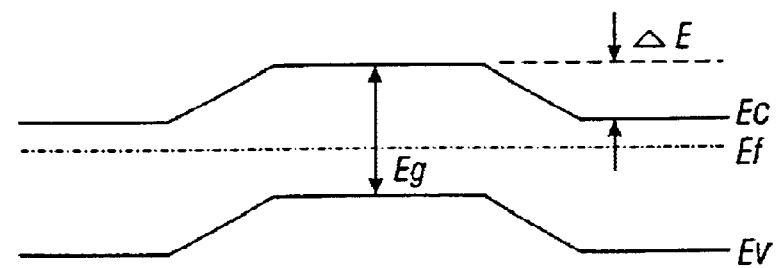
FIGS. 7A and 7B are diagrams for explaining an energy state.
Figure 7B:
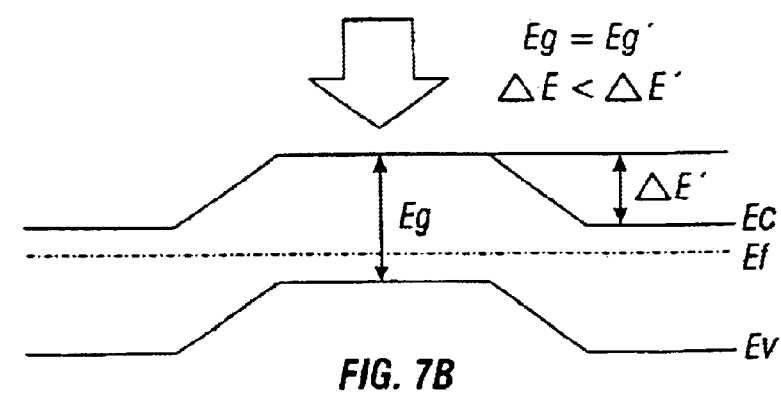

In other words, as described above, in a graph shown in FIG. 5, it is found that the S-value represents an inverse number of the slope in a region denoted by reference numeral 501. Also, the expression of EX. 3 can be approximately replaced by the following expression.

$$S \approx 1n10 \cdot kT/q[1+(Cd+Cit)/Cox] \quad [\text{EX. 4}]$$

In Ex. 4, k is the Boltzmann's constant, T is an absolute temperature, q is the amount of charges, Cd is a capacity of the depletion layer, Cit is an equivalent capacity of an interfacial level, and Cox is a capacity of the gate oxide film. Hence, according to the present invention, since the capacity Cd of the depletion layer is sufficiently smaller than that of the prior art, the S value can be set to a small value of 85 mV/decade or less (preferably, 70 mV/decade or less), that is, an excellent sub-threshold characteristic can be obtained.

Also, the object of the present invention is to allow the capacity Cd of the depletion layer and the equivalent capacity Cit of the interfacial level to approach 0 as much as possible. In other words, the object is to approach an S value (60 mV/decade) in an ideal state of Cd=Cit=0.

Further, it is very important that the impurity regions in the form of a linear pattern is disposed as shown in FIG. 1A for an improvement of the mobility which is a representative parameter indicating the performance of the FET. The reason will be described hereinafter.

The mobility is determined in accordance with the scattering of carriers in a semiconductor (a silicon substrate in this embodiment), and the scattering in the silicon substrate is roughly classified into the lattice scattering and the impurity scattering. The lattice scattering is low in the concentration of impurities in the silicon substrate and controllable at a relatively high temperature, and the impurity scattering is high in the concentration of the impurity and controllable at a relatively low temperature. The entire mobility $\mu$ obtained by influencing them on each other is represented by the following expression.

$$\mu=(1/\mu_1+1/\mu i)^{-1} \quad [\text{EX. 5}]$$

The EX. 5 means that the entire mobility $\mu$ is reversely proportional to a sum of the inverse number of the mobility $\mu_1$ ($_1$ means lattice) when being influenced by the lattice scattering and the inverse number of the mobility $\mu_i$ ($_i$ means impurity) when being influenced by the impurity scattering.

In this example, in the lattice scattering, if a drift electric field is not much strong, an acoustic phonon plays the significant role, and the mobility $\mu_1$ at that time is proportional to −3/2 power of a temperature as indicated in the following expression. Hence, it is determined in accordance with the effective mass (m*) of the carriers and the temperature (T).

$$\mu_1 \propto (m^*)^{-5/2} T^{-3/2} \quad [\text{EX. 6}]$$

Also, the mobility $\mu_i$ caused by the impurity scattering is proportional to 3/2 power of the temperature as indicated by the following expression and inversely proportional to the concentration $N_i$ of the impurities ionized. In other words, the mobility $\mu_i$ can be changed by adjusting the concentration $N_i$ of the ionized impurities.

$$\mu i \propto (m^*)^{-1/2} N_i^{-1} T^{3/2} \quad [\text{EX. 7}]$$

According to the above expressions, in the channel dope where the impurities are added to the entire channel formation region as in the prior art, the mobility cannot be increased because of an influence of the impurity scattering. However, in the present invention, since the impurity regions are locally formed, no impurity is added between the adjacent impurity regions (a region having a width of Wpa).

In other words, because EX. 7 logically means that the concentration $N_i$ of the ionized impurities approaches 0 without limit, the mobility $\mu_i$ approaches an infinite without limit. In other words, since the EX. 5 means that the impurities are reduced to the degree that a term of $1/\mu_i$ can be ignored, the entire mobility $\mu$ approaches the mobility $\mu_1$ without limit.

Also, it is logically possible that the effective mass (m*) of the carriers is reduced so that the mobility $\mu_1$ is further increased. This is performed by employing a phenomenon where the effective mass of the carriers (in particular, in case of electrons) is changed depending on the axial direction of a crystal axis in a region of an extremely low temperature.

According the literature, when it is structured such that a direction along which carriers move is identical with <100> axial direction of a monocrystal silicon, the minimum effective mass can be obtained. This example is a result in a region of the extremely low temperature of 4° K.

Also, it is desirable that the channel direction and the axial direction (arranging direction) of the impurity region 110 are made substantially in parallel with the axial direction of the crystal lattices (an axial replacement is within ±10°) so that the carriers well pass through between the crystal lattices. In case of monocrystal, since the silicon atoms are regularly arranged, the carriers which move in parallel to a direction along which the crystal lattices are arranged are hardly influenced by the scattering of the lattices.

For example, if the rotating axis in the above direction in the monocrystal silicon substrate is set to 0°, also in case of the rotating axes of 90°, 180° and 270°, the same effect can be obtained. Accordingly, in the power MOS where the carriers move as shown in FIG. 1A, the above structure can be formed in all the directions except for corners.

As described above, the carriers that move in the channel formation region pass through a region other than the impurity regions which exist within the channel formation region. It is presumed that the energy state of the carrier moving path (hereinafter, this path is called "lane region") is in a state shown in FIG. 9, which is caused by the impurity regions in the form of the linear pattern.

Figure 9A:
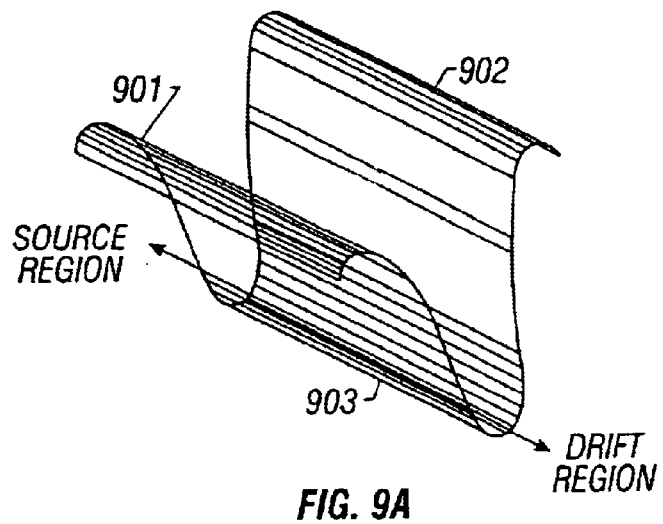
FIGS. 9A and 9B are diagrams for explaining the action of carriers.

In FIG. 9A, regions denoted by reference numeral 901 and 902 show energy states of the impurity regions, each of which forms a high energy barrier. As the regions are away from the impurity regions, they gradually come to a state 903 which is low in energy. In other word, the carriers that move in the channel region (in this embodiment, electrons are exemplified) move in the region 903 which is low in energy state by priority, and the energy barriers 901 and 902 (impurity regions) function as a wall.

In this example, an image of the carriers (electrons) that move in the channel region is schematically shown in FIG.

9B. As a image, the carriers 900 that move in the channel region, as shown in FIG. 9B, are controlled in their directivity as if they are spheres that roll in an eaves trough, and move from the source region toward the drain region by substantially the shortest distance.

Figure 9B:
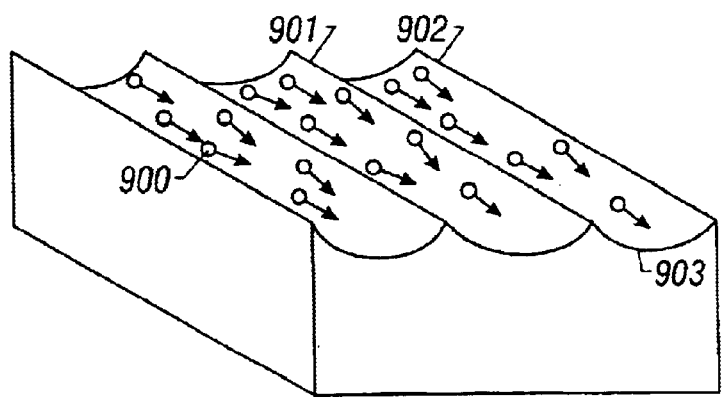

Also, as shown in FIG. 9B, the lane regions shown in FIG. 9A are disposed in a plurality of rows in parallel, but because they do not exceed regions indicated by reference numerals 901 and 902, the carriers do not move between the adjacent lane regions.

For the above reason, since the possibility that the carriers collide with one another is remarkably reduced, the mobility greatly improves. In other words, the structure of the present invention not only reduces the scattering of impurities but also reduces the scattering caused by self-collision between the carriers, thereby being capable of realizing a remarkable improvement of the mobility.

As described above, an idea of the present invention that the energy barrier (grain boundary or the like) which has always adversely affected the operation in the prior art is intentionally formed and employed contrary to the prior art is very novel.

Further, it is very important that the impurity regions 110 are disposed in the channel formation region 111 as shown in FIGS. 1A and 1C, for reducing the lowering of the threshold value voltage which is caused by the short channel effect. This is because that structure is necessary for intentionally producing a narrow channel effect.

For example, the width W of the channel formation region 111 is divided by the impurity region 110 as shown in FIG. 1A, so that it can be substantially regarded as an assembly consisting of a plurality of channel formation regions having a narrow channel width Wpa,m.

In other words, the narrow channel effect can be obtained in the plurality of regions having the narrow channel width Wpa. From the macro viewpoint, since the narrow channel effect can be thus obtained in the entire channel formation region as shown in FIG. 1A, it is considered that the narrow channel effect can be obtained as a whole, thus increasing the threshold value voltage.

Hence, even though the threshold value voltage is lowered by the short channel effect which is caused by shortening the channel length, the threshold value voltage is intentionally increased by the narrow channel effect so that the threshold value voltage can be controlled for the above reason, as a result of which a change in the threshold value voltage can be released.

EMBODIMENT 2

This embodiment shows a case in which the shape of impurity regions formed in the channel formation region is made in the form of a dot pattern. A description will be given with reference to FIG. 10.

Figure 10A:
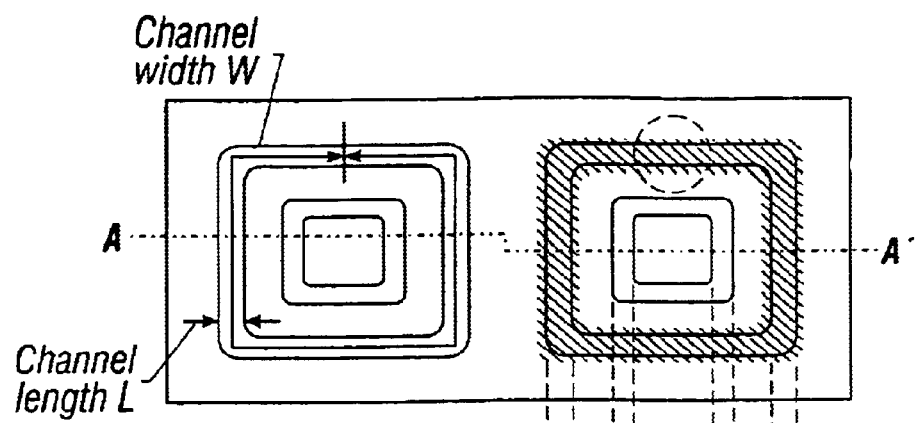
FIGS. 10A to 10C are diagrams showing the structure of a power MOS device.
Figure 10B:
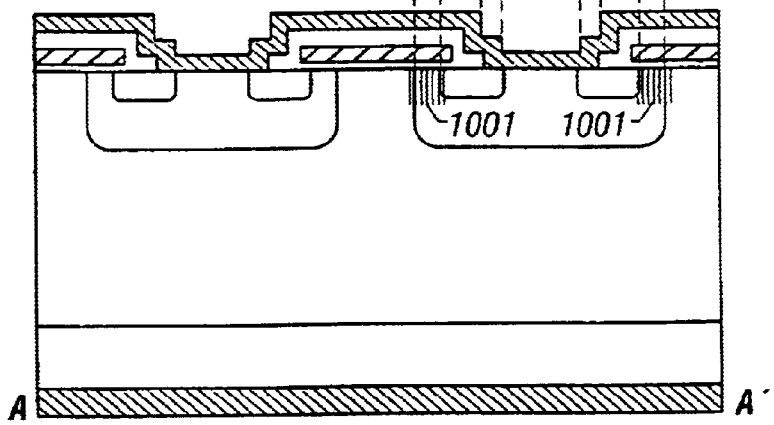

The structure of the power MOS shown in FIG. 10 is such that the impurity regions having a linear pattern in FIG. 1 is replaced by the shape of a dot pattern. First, what is different from FIG. 1 resides in that impurity regions 1001 are disposed as shown in FIG. 10B.

Figure 10C:
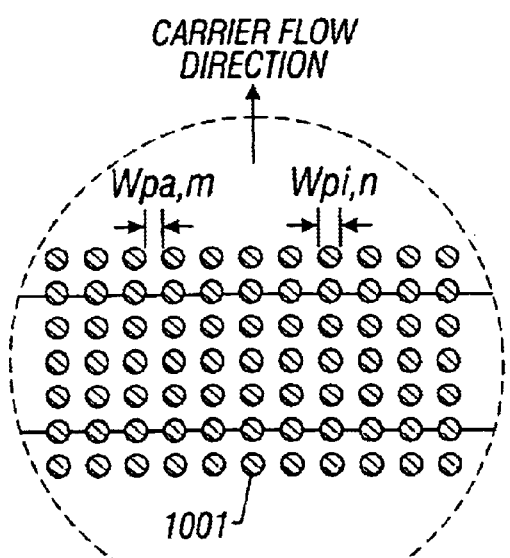

An enlarged diagram of the impurity regions 1001 when being viewed from a top surface thereof is shown in FIG. 10C. It should be noted that in this embodiment, circular impurity regions are described as the impurity regions shaped in a dot pattern, but the dot pattern can be shaped in an ellipse, a square, a rectangle, or the like.

Figure 11A:
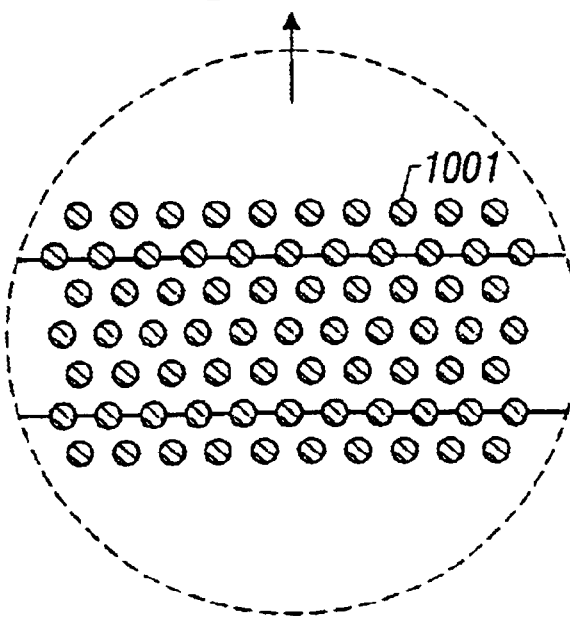
FIGS. 11A and 11B are diagrams showing a pattern in which impurity regions are disposed.

For example, the dot pattern may be shaped into a pattern in which impurity regions 1101 are engaged with each other as shown in FIG. 11A. In this case, since it is structured such that gaps between the respective impurity regions 1101 are compensated with next rows, the extension of the depletion layer can be effectively restrained. This structure exhibits the effect in a region where the channel length is particularly short.

Figure 11B:
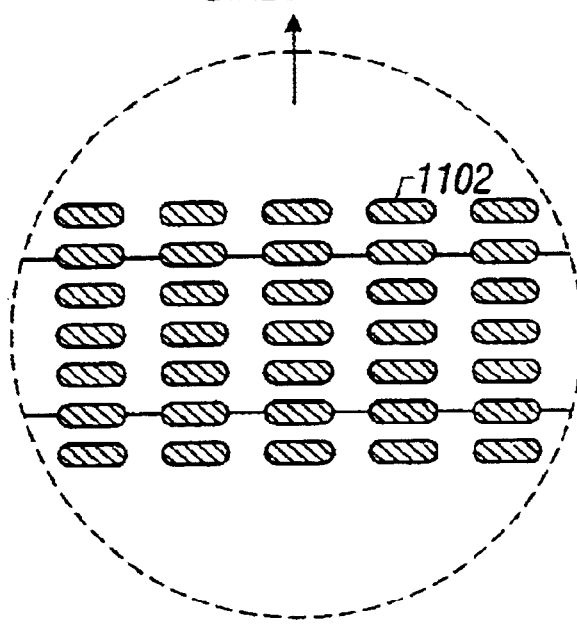

Also, a structure where the impurity regions are made an ellipse perpendicular to the channel direction as shown in FIG. 11B is very effective because the extension of the depletion layer is restrained.

EMBODIMENT 3

In the present invention, as a means for forming the impurity regions in the channel formation region, there can be applied a method of employing the segregating property of impurities. In this embodiment, as an example of this method, a method of employing the segregation of boron (B) and phosphorus (P) in the vicinity of a heat oxide film will be described with reference to FIG. 14.

In manufacturing the power MOS of the structure described in Embodiment 1, a heat treatment of about 800 to 1100° C. is conducted after impurity regions are formed with addition of impurities, as a result of which oxygen and silicon (Si) as added reacts with each other to form a heat oxide.

Then, the impurity elements (boron or phosphorus) which have been contained in the periphery of the impurity regions are segregated in the oxide region. How the concentration of boron or phosphorus is distributed in the vicinity of an interface between the heat oxide film and silicon through the heat oxidizing process will be described with reference to FIG. 14.

As shown in FIG. 14, the added ions (B,P) that exist in Si are re-distributed when an oxide film is formed thereon. This is a phenomenon that occurs because the solubility and the rate of diffusion of the added ions are different in silicon (Si) and the heat oxide film ($SiO_x$). Assuming that the solubility of the impurities in Si is $[C]_{Si}$ and the solubility of the impurities in $SiO_X$ is $[C]_{SiOx}$, the equilibrium segregation coefficient m is defined by the following expressions.

$$m=[C]_{Si}/[C]_{SiOx}$$

Figure 14A:
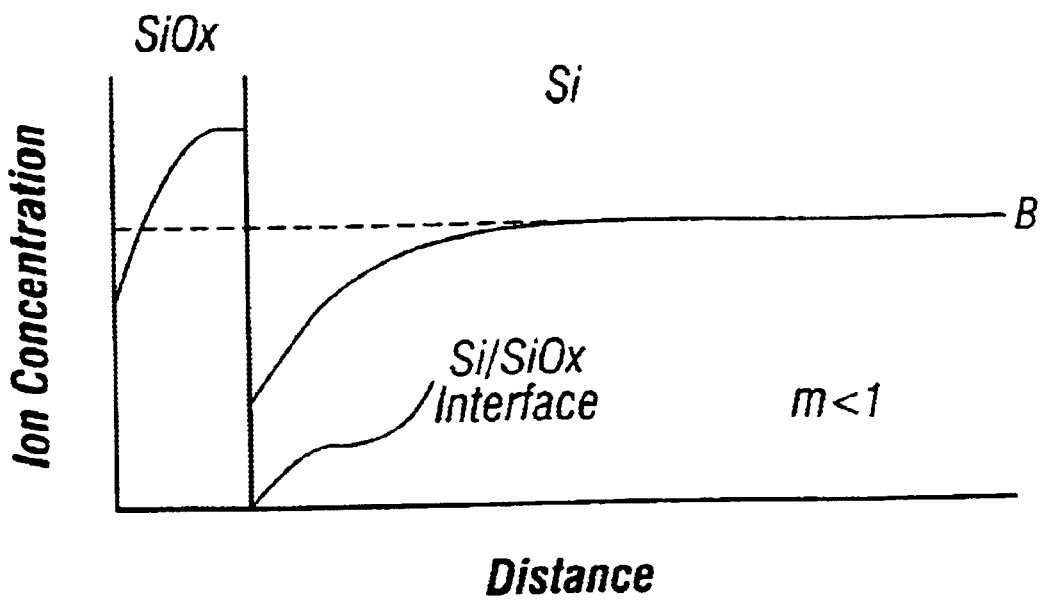
FIGS. 14A and 14B are diagrams for explaining the segregating state of impurities.

In this case, the segregation of the impurities in the vicinity of the interface between Si and $SiO_x$ is controlled by a value of m. Normally, assuming that the diffusion coefficient of the impurities in Si is sufficiently large, in case of m<1, the impurities in Si are taken into $SiO_2$ (FIG. 14A). Also, in case of m>1, $SiO_x$ excludes the impurities, as a result of which the concentration of the impurities in the vicinity of the interface between Si and $SiO_x$ increases (FIG. 14B).

According to literatures, the value m of boron is about 0.3, and the value m of phosphorus is about 10. Hence, the distribution of concentration of boron after the heat oxidizing process in this embodiment is exhibited as shown in FIG. 14A, and boron is taken into the heat oxide film in such a manner that the concentration of boron on both of side surfaces of the impurity regions (in the vicinity of the interface between Si and $SiO_x$) comes to a state in which its amount is very small. On the contrary, a large amount of boron is contained in the heat oxide as formed.

Although such a phenomenon that boron is taken into the heat oxide film has already been known, an idea of employing the phenomenon in order to form an energy barrier (impurity regions) as in the present invention is completely novel.

Figure 14B:
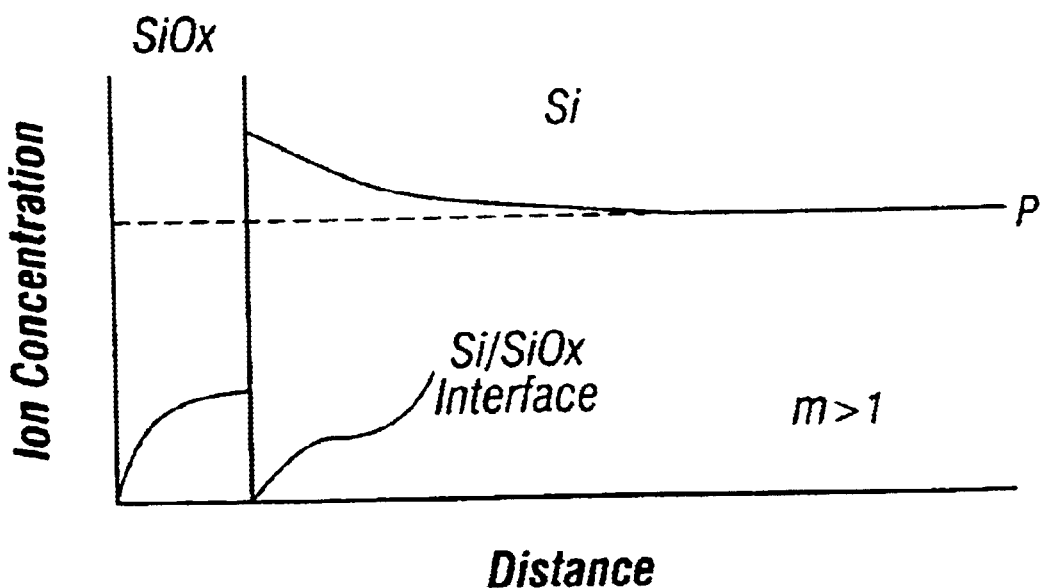

It should be noted that as shown in FIG. 14B, in the case of using phosphorus as the impurity elements, phosphorus is segregated (piled up) to the interface of the thermal oxide film and silicon. The phenomenon can also be applied in forming the impurity regions in the p-channel FET.

As described above, the use of the segregating phenomenon of phosphorus or boron to an oxide as in this embodiment enables the mobility to be remarkably improved. This is because when this embodiment is implemented, since the impurities (phosphorus or boron) in the periphery of the impurity region (representatively, an oxide represented by $SiO_x$,) are caused to be collected in the impurity regions, an influence of scattering of the impurities in a region where carriers move between the impurity regions can be remarkably reduced.

Since this means that $\mu_i$ increases in EX. 5 as described above, the entire mobility $\mu$ approaches $\mu=\mu_1$. In other words, an extremely large mobility can be realized which is substantially determined by only the scattering of the lattice.

EMBODIMENT 4

In the present specification, the power MOS FET was described as a representative example, however, the present invention is applicable to all of other power MOS devices. As other power MOS devices, there can be recited, for example, an IGBT (insulated gate bipolar transistor, an MCT (CMOS controlled thyristor), an EST (emitter switched thyristor), a BRT (base resistance controlled thyristor), an IEGT (injection enhanced insulated gate bipolar transistor), a DGMOS (double gate MOS), and so on. In particular, in recent years, as applied products of the power MOS FET and the IGBT, an IPM (intelligent power module), a power IC and so on are mainly used.

In this embodiment, the IGBT, the MCT and the EST in the above power MOS devices will be described in brief with reference to FIG. 12.

First, the IGBT is directed to a power device where the high-speed switching characteristic of the MOS FET and the low on-state voltage characteristic of the bipolar transistor are integrated into one chip. In a basic structure of the n-channel IGBT shown in FIG. 12A, what are different from the power MOS FET reside in that the $n^+$ region of the drain side is replaced by a $p^+$ region 1201, and that one p-n junction is added to the device.

During driving operation, because holes (positive holes) are implanted from the $p^+$ region 1201 toward an $n^-$ region 1202 that forms a drift region so that electrons in the $n^-$ region 1202 are attracted, the density of electrons in the $n^-$ region 1202 increases. As a result, the resistance of the $n^-$ region 1202 is extremely lowered with the result that on-operation is conducted at a voltage lower than that of the power MOS.

The IGBTs have been developed which are of a variety of structures such as a non-latch-up structure in which an $n^+$ region is sandwiched as a buffer layer between the $p^+$ region 1201 and the $n^-$ region 1202, a trench structure in which the number of cells per unit area of a chip is improved using the trench technique, and other structures.

Figure 12A:
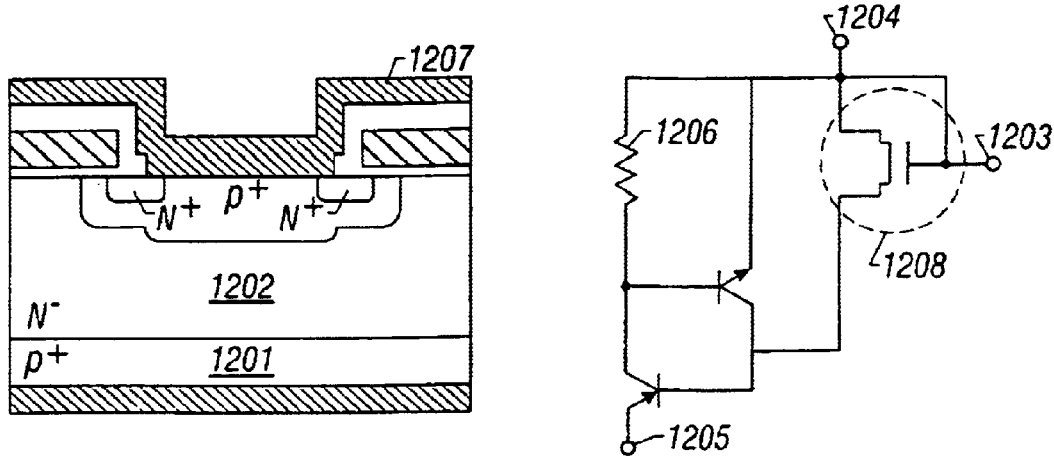
FIG. 12 is a diagram showing the structure of a power MOS device.

The left side of FIG. 12A shows an equivalent circuit of the IGBT, in which reference numeral 1203 denotes a gate terminal, reference numeral 1204 denotes an emitter terminal, and reference numeral 1205 denotes a collector terminal. Reference numeral 1206 is a resistor disposed between the $p^+$ region 1201 and an emitter electrode 1207. Also, what is indicated by reference numeral 1208 is an n-channel enhancement transistor.

Figure 12B:
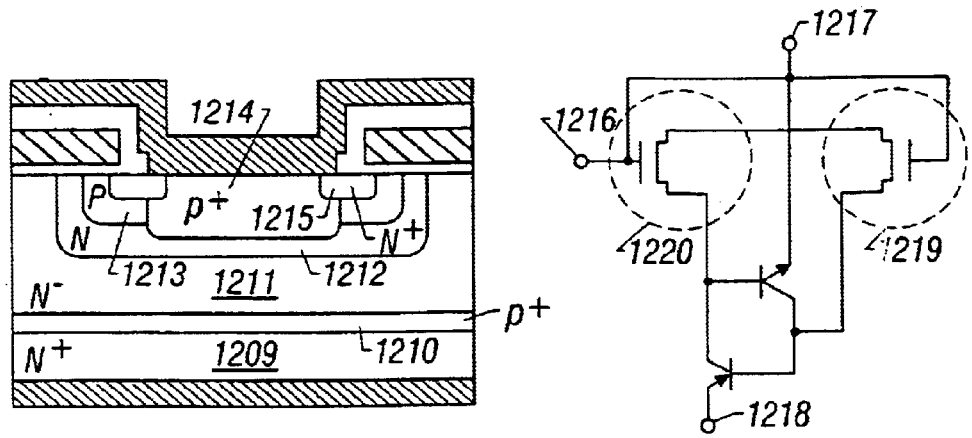

Subsequently, the MCT will be described. In this embodiment, the p-channel enhancement MCT which is a mainly used MCT will be described. As shown in FIG. 12B, the MCT structure is of a vertical triple diffusion structure, which is structured in such a manner that a $p^+$-type silicon layer 1210 and a $p^-$-type silicon layer 1211 are formed through epitaxial growth on an $n^+$-type silicon substrate 1209.

Furthermore, after an n-type diffusion layer 1212 and a p-type diffusion layer 1213 have been formed, a $p^+$-type diffusion layer 1214 and an $n^+$-type diffusion layer 1215 are formed into a triple diffusion structure. It should be noted that, for example, n-type means conductivity weaker than $n^+$-type but stronger than $n^-$-type.

The p-channel enhancement MCT is characterized in that a withstand voltage is high regardless of the on-state voltage being low, and enables a high withstand voltage characteristic further higher in reliability to be obtained with the application of the present invention.

The left side of FIG. 12B is an equivalent circuit, in which reference numeral 1216 denotes a gate terminal, reference numeral 1217 denotes an anode terminal, and reference numeral 1218 denotes a cathode terminal. Also, reference numeral 1219 denotes a p-channel enhancement transistor (which is called "on-FET"), and reference numeral 1220 denotes an n-channel enhancement transistor (which is called "off-FET").

Then, the EST will be described. The EST is structured in such a manner that an IGBT and a thyristor are arranged laterally into a vertical double diffusion structure. Also, as shown in FIG. 12C, the EST is structured in such a manner that an $n^+$-type silicon layer 1222 and an $n^-$-type silicon layer 1223 are formed through epitaxial growth.

Further, after an $p^-$-type diffusion layer 1224 and a $p^+$-type diffusion layer 1225 have been formed, $n^+$-type diffusion layers 1226 and 1227 are formed. The EST is characterized in that a withstand voltage is high regardless of the on-state voltage being low as in the MCT, and enables a high withstand voltage characteristic further higher in reliability to be obtained with the application of the present invention.

Figure 12C:
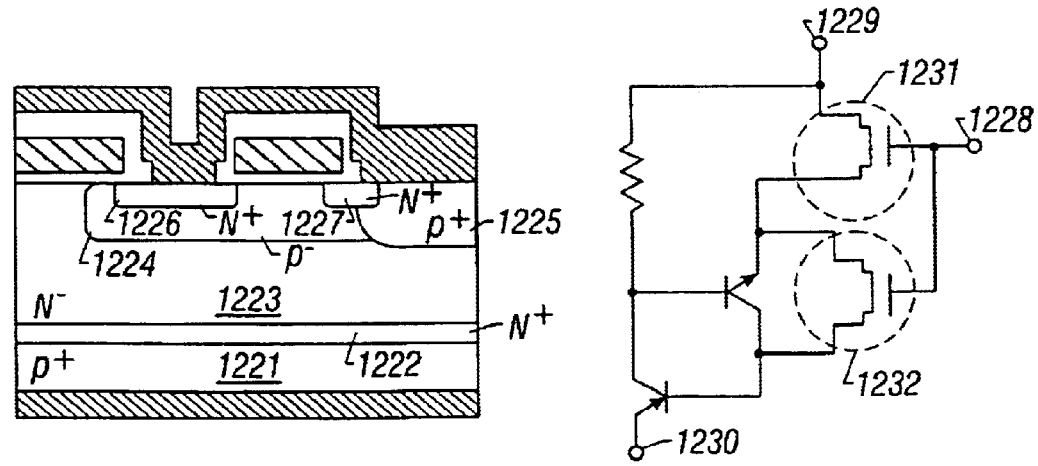

The left side of FIG. 12C is an equivalent circuit, in which reference numeral 1228 denotes a gate terminal, reference numeral 1229 denotes a cathode terminal, and reference numeral 1230 denotes an anode terminal. Also, reference numeral 1231 and 1232 denote an n-channel enhancement transistor.

As described above, the present invention can be applied to all kinds of the power MOS devices of the gate insulation type (MOS gate type), and its applicable range is extremely wide from the industrial viewpoint.

EMBODIMENT 5

The power MOS device manufactured in accordance with the present invention is a device extremely wide in applicable range. In this embodiment, its representative example will be described with reference to FIGS. 13A to 13D.

What is shown in FIG. 13A is a video deck, in which reference numeral 1301 denotes a main body, reference numeral 1302 denotes a tape insertion section, reference numeral 1303 denotes an external terminal section, reference numeral 1304 denotes an image editing dial, and reference numeral 1305 denotes a liquid-crystal display section. Also, reference numeral 1306 is an integrated circuit equipped in the inside of the video deck, and a power module is inserted as a part of the integrated circuit, and a power MOS device 1307 is used as its structural device.

Also, what is shown in FIG. 13B is a battery type shaver, in which reference numeral 1308 denotes a main body, reference numeral 1309 denotes a switch, and reference numeral 1310 denotes a shaving section. Also, reference numeral 1311 is a charger equipped in the inside of the shaver, and a power MOS device 1312 is used for control of a current in the battery type shaver.

Further, what is shown in FIG. 13C is a fluorescent lamp, in which reference numeral 1313 denotes a fluorescent light, reference numeral 1314 denotes a lamp shade, and reference numeral 1315 denotes a control section. Also, reference numeral 1316 is an integrated circuit equipped in the inside of the fluorescent lamp, and a power MOS device 1317 is used for control of an inverter in a fluorescent light.

Further, what is shown in FIG. 13D is an electric tool, in which reference numeral 1318 denotes a main body, reference numeral 1319 denotes a drill, reference numeral 1320 denotes a handling section, and reference numeral 1321 denotes a consent. Also, reference numeral 1322 is an integrated circuit equipped in the inside of the electric tool, and a power MOS device 1323 is used for control of a speed of the electric tool.

Besides the above examples, the power MOS devices are applied to products in a variety of fields such as the vehicle control system and the body system of a vehicle, a television, a camera, a power supply for a computer, an air conditioner, a programmable logic control or the like. Thus, the power MOS devices are devices very wide in an applicable range.

As was described above, according to the present invention, the short channel effect occurring when the channel length is shortened can be prevented. In particular, the depletion layer in the vicinity of the drift region is prevented from extending up to the lower portion of the channel formation region and the source region by the impurity regions which are locally formed in the channel formation region, so that the drain voltage is not influenced by the energy (potential) state of the channel formation region. As a result, the punch-through phenomenon and the sub-threshold characteristic can be prevented from being deteriorated. Also, the high drain withstand voltage can be realized at the same time.

Also, the lowering of the threshold value voltage which is one feature of the short channel effect can be restrained by an increase of the threshold value voltage which is caused by the narrow channel effect. The narrow channel effect is an effect which is artificially performed by the structure of the present invention in which the impurity regions are locally formed in the channel formation region.

As described above, according to the present invention, even in the power MOS device in the deep sub-micron region which is short in channel length, operation can be performed without occurrence of the short channel effect.

Also, according to the present invention, with the formation of the energy slit-like lane regions in the channel formation region, the carrier moving direction is regulated, thereby being capable of reducing the scattering caused by the collision of the carriers with each other.

In other words, the impurity scattering that causes the deterioration of the mobility of the carriers, the lattice scattering, and the scattering which is caused by the collision of the carriers with each other are largely reduced, thereby greatly improving in mobility.

With the above-mentioned effects, the power MOS device that can realize the high-speed operation characteristic and the high withstand voltage characteristic together can be manufactured. Hence, it is possible to improve the performance of the electronic and electric equipments in every field where the power MOS device is used. Therefore, the present invention is very useful in the technical and industrial field.

The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. An insulated gate bipolar transistor comprising:

a p+ type semiconductor layer;

an n− type semiconductor layer on said p+ type semiconductor layer, said n− type semiconductor layer including a drift region;

a p+ type region formed on said n− type semiconductor layer wherein said p+ type region includes a channel region;

an n+ type source region formed in said p+ type region;

a gate electrode formed over said p+ type region, wherein said channel region includes a region in which carriers move, and an impurity region for pinning a depletion layer that extends from said drift region toward said channel region and said source region, wherein said impurity region is adjacent to said region in which carriers move, and is doped locally with oxygen.

2. The semiconductor device according to claim 1 wherein said impurity region is electrically insulating.

3. An insulated gate bipolar transistor comprising:

a p+ type semiconductor layer;

an n− type semiconductor layer on said p+ type semiconductor layer;

a p+ type region formed on said n− type semiconductor layer wherein said p+ type region includes a channel region;

an n+ type source region formed in said p+ type region;

a gate electrode formed over said p+ type region, wherein said channel region is selectively doped with an impurity so as to form an impurity region in which a distribution of said impurity periodically changes in a direction perpendicular to a carrier flow direction in said channel region, wherein said impurity region is doped locally with oxygen.

4. The semiconductor device according to claim 3 wherein said impurity region is electrically insulating.

5. An insulated gate bipolar transistor comprising:

a P+ type semiconductor layer;

an N− type semiconductor layer on said P+ type semiconductor layer;

a P+ type region formed on said N− type semiconductor layer wherein said P+ type region includes a channel region;

an N+ type region formed in said P+ type region;

a gate electrode formed over said P+ type region, wherein said channel region includes a region in which carriers move, and an impurity region locally doped with an impurity for controlling a threshold voltage, wherein said impurity region is adjacent to said region in which carriers move, and is doped locally with oxygen.

6. The semiconductor device according to claim 5 wherein said impurity region is electrically insulating.

7. The transistor according to any one of claims 1–5 wherein said transistor is used in a power module of a video deck.

8. The transistor according to any one of claims 1–5 wherein said transistor is used in a battery type shaver.

9. The transistor according to any one of claims 1–5 wherein said transistor is used in a fluorescent light.

10. The transistor according to any one of claims 1–5 wherein said transistor is used in an electronic tool.

11. An insulated gate bipolar transistor comprising:

a p+ type semiconductor layer;

an n– type semiconductor layer on said p+ type semiconductor layer, said n– type semiconductor layer including a drift region;

a p+ type region formed on said n– type semiconductor layer wherein said p+ type region includes a channel region;

an n+ type source region formed in said p+ type region;

a gate electrode formed over said p+ type region, wherein said channel region includes a region in which carriers move, and an impurity region for pinning a depletion layer that extends from said drift region toward said channel region and said source region, wherein said impurity region is adjacent to said region in which carriers move, and is doped locally with at least one element selected from the group consisting of carbon, nitrogen and oxygen.

12. An insulated gate bipolar transistor comprising:

a p+ type semiconductor layer;

an n– type semiconductor layer on said p+ type semiconductor layer;

a p+ type region formed on said n– type semiconductor layer wherein said p+ type region includes a channel region;

an n+ type source region formed in said p+ type region;

a gate electrode formed over said p+ type region;

wherein said channel region is selectively doped with an impurity in such a manner that a distribution of said impurity periodically changes in a direction perpendicular to a carrier flow direction in said channel region, wherein said impurity region is doped locally with at least one element selected from the group consisting of carbon, nitrogen and oxygen.

13. An insulated gate bipolar transistor comprising:

a P+ type semiconductor layer;

an N– type semiconductor layer on said P+ type semiconductor layer;

a P+ type region formed on said N+ type semiconductor layer wherein said P+ type region includes a channel region;

an N+ type region formed in said P+ type region;

a gate electrode formed over said P+ type region, wherein said channel region includes a region in which carriers move, and an impurity region locally doped with an impurity for controlling a threshold voltage, wherein said impurity region is adjacent to said region in which carriers move, and is doped locally with at least one element selected from the group consisting of carbon, nitrogen and oxygen.

* * * * *